United States Patent [19]
Kurahashi

[11] Patent Number: 5,657,081
[45] Date of Patent: Aug. 12, 1997

[54] ELECTRONIC APPARATUS HAVING A MAIN BODY AND LOADABLE STORAGE UNIT

[75] Inventor: Sunao Kurahashi, Kanagawa-ken, Japan

[73] Assignee: Canon Kabushiki Kaisha, Tokyo, Japan

[21] Appl. No.: 456,285

[22] Filed: May 31, 1995

Related U.S. Application Data

[63] Continuation of Ser. No. 101,351, Aug. 2, 1993.

[30] Foreign Application Priority Data

Aug. 31, 1992 [JP] Japan ................ 4-253574

[51] Int. Cl.$^6$ .................. H04N 5/76; H04N 5/225
[52] U.S. Cl. ............... 348/233; 348/375; 358/906; 360/99.06; 439/331
[58] Field of Search .................. 348/231, 233, 348/373, 374, 375; 360/99.02, 99.06; 235/441; 439/929.1, 928.1, 326, 331; 358/906, 909.1; H04N 5/76, 5/225

[56] References Cited

U.S. PATENT DOCUMENTS

| | | | |
|---|---|---|---|
| 4,652,976 | 3/1987 | Fushimoto | 361/413 |
| 5,032,921 | 7/1991 | Harase | 358/229 |
| 5,072,317 | 12/1991 | Fukushima | 360/71 |
| 5,159,458 | 10/1992 | Murata et al. | 358/229 |
| 5,179,505 | 1/1993 | Matsuo | 361/395 |
| 5,206,731 | 4/1993 | Takaiwa | 358/209 |
| 5,361,181 | 11/1994 | Kurata | 360/99.02 |

FOREIGN PATENT DOCUMENTS

| | | | |
|---|---|---|---|
| 0217668 | 6/1987 | European Pat. Off. | H05K 5/00 |
| 1248877 | 10/1989 | Japan | H04N 5/225 |
| 2270475 | 11/1990 | Japan | H04N 5/225 |

*Primary Examiner*—Thai Tran
*Assistant Examiner*—Ngoc-Yen Vu
*Attorney, Agent, or Firm*—Robin, Blecker, Daley & Driscoll

[57] ABSTRACT

An electronic apparatus includes a main body which has a plurality of electrical contacts and an information storing part which can be loaded and unloaded on and from the main body and also has a plurality of electrical contacts arranged to be connectable with the electrical contacts of the main body. The apparatus has a moving member which is arranged to carry the information storing part and to be movable only between first and second positions, in such a way as to have the plurality of electrical contacts of the information storing part not connected to the plurality of electrical contacts of the main body when the moving member is in the first position and connected to the plurality of electrical contacts of the main body when the moving member is in the second position. The arrangement permits the information storing part to be easily and smoothly loaded and unloaded on and from the main body without being damaged, with a relatively small force, and also permits a reduction in size, weight and cost of the electronic apparatus.

14 Claims, 18 Drawing Sheets

ELECTRONIC APPARATUS HAVING A MAIN BODY AND LOADABLE STORAGE UNIT

This is a continuation application under 37 CFR 1.62 of prior application Ser. No. 08/101,351, filed Aug. 2, 1993.

BACKGROUND OF THE INVENTION

1. Field of the Invention

This invention relates to an electronic apparatus having a main body and an information storing part which can be loaded on and unloaded from the main body.

2. Description of the Related Art

Electronic apparatuses such as electronic still cameras include cameras of the kind using a card called a memory card on which a solid-state memory is mounted as a recording medium. The electronic still camera of this kind has been arranged to have the memory card attached to and detached from the camera in the following manner:

FIG. 1 shows by way of example the conventional electronic still camera. In FIG. 1, reference numeral 101 denotes the main body of the electronic still camera. Reference numeral 1 denotes a memory card which is arranged as an interchangeable recording medium. An inserting opening 102 is provided in the main body 101 for inserting the memory card 1. An eject button 103 is provided for ejecting the memory card 1. FIG. 2 shows the memory card 1. As shown, the memory card 1 is provided with a group of contact holes 1a for electrical communication to be conducted with the main body 101 of the electronic still camera when the memory card 1 is mounted on the main body 101. The contact holes 1a are arranged to be connectable with a connector 107 which is arranged on the side of the main body 101 of the electronic still camera. FIG. 3 shows arrangement made inside the inserting opening 102, including a slider 104, an interlocking lever 105, an eject lever 106, the above-stated eject button 103 and the connector 107 provided for electrical communication with the memory card 1.

The memory card 1 is attached and detached to and from the main body 101 in the following manner: Referring to FIG. 3, when the memory card 1 is being inserted in the direction of arrow A, the foreend part of the memory card 1 comes to interfere with bent parts 104a of the slider 104 as shown in FIG. 4. When the memory card 1 is being inserted further, a group of signal pins 107a of the connector 107 come into the group of contact holes 1a of the memory card 1 to be electrically connected with them. The slider 104 then also moves in the direction of arrow A together with the memory card 1. This movement of the slider 104 causes the interlocking lever 105 to turn clockwise. The eject lever 106 and the eject button 103 then move in a direction reverse to the direction of arrow A. As a result, the eject button 103 comes to protrude from the main body 101 of the electronic still camera, and the insertion of the memory card 1 comes to an end as shown in FIG. 5.

In ejecting the memory card 1, the eject button 103 is pushed in the direction of arrow A. With the eject button 103 pushed, the interlocking lever 105 turns counterclockwise to cause the slider 104 and the memory card 1 to move in a direction reverse to the direction of arrow A. The electronic still camera comes into the state shown in FIG. 4 to have the memory card 1 disconnected from the connector 107 and caused to protrude much from the main body 101 of the electronic still camera. The memory card 1 thus can be easily taken out.

However, the conventional electronic still camera arranged as described above by way of example has presented the following problems:

The connector 107 must be provided with a great number of signal pins 107a, including 20 to nearly 70 pins, for exchange of signals with the memory card 1. A large pushing force of 1 to 3 kgf is necessary, therefore, for inserting the memory card 1 into the connector 107. The memory card 1 thus cannot be easily attached or detached directly with fingers. Further, if the memory card 1 is pushed in a biased manner, the memory card 1 cannot be correctly loaded and tends to be damaged.

Further, when the electronic still camera is not loaded with the memory card 1, a foreign matter tends to come into the inserting opening 102. The presence of such a foreign matter tends to damage the connector 107 when the memory card 1 is inserted to be connected to the connector 107. Besides, the conventional electronic still camera does not easily permit a waterproof or dripproof arrangement.

In order to lessen a force required for pushing the eject button 103, the eject button 103 must be arranged to have a long stroke. Such arrangement, however, causes the eject button 103 to protrude too much from the main body 101 to hinder a shooting operation with the memory card 1 loaded on the electronic still camera.

SUMMARY OF THE INVENTION

It is a general object of this invention to provide an electronic apparatus arranged to solve the problems of the prior art mentioned in the foregoing.

It is a more specific object of this invention to provide an electronic apparatus which is arranged to permit an information storing part to be easily attached and detached to and from the main body of the apparatus.

Under this object, an electronic apparatus arranged according to this invention as one embodiment thereof comprises a main body having a plurality of electrical contacts, an information storing part arranged to have a plurality of electrical contacts which are connectable with the plurality of electrical contacts of the main body and to be detachably attachable to the main body, a moving member arranged to carry the information storing part and to be movable, driving means for moving the moving member, and restricting means arranged to restrict a movable range of the moving member to be moved by the driving means between a first position and a second position and to restrict the position of the moving member in such a manner that the plurality of electrical contacts of the information storing part are not connected to the plurality of electrical contacts of the main body when the moving member is in the first position and are connected to the plurality of electrical contacts of the main body when the moving member is in the second position.

It is another object of this invention to provide an electronic apparatus arranged to permit an information storing part to be smoothly attached and detached to and from the main body of the apparatus without damaging the information storing part.

Under that object, an electronic apparatus arranged according to this invention as one embodiment thereof comprises a main body having a plurality of electrical contacts, an information storing part arranged to have a plurality of electrical contacts which are connectable with the plurality of electrical contacts of the main body and to be detachably attachable to the main body, a moving member arranged to carry the information storing part and to be movable, and restricting means arranged to allow the moving member to move between a first position and a second position and to restrict the position of the moving member in such a manner that the plurality of the electrical contacts of the information storing part are loosely fitted on the plurality of electrical contacts of the main body when the moving member is in the first position and are connected to the plurality of electrical contacts of the main body when the moving member is in the second position.

It is a further object of this invention to provide an electronic apparatus arranged to permit an information storing part to be attached and detached to and from the main body of the apparatus with a relatively small force and to permit a reduction in size, weight and cost of the apparatus.

Under the above-stated object, an electronic apparatus arranged according to this invention as one embodiment thereof comprises a main body having a plurality of electrical contacts, an information storing part arranged to have a plurality of electrical contacts which are connectable with the plurality of electrical contacts of the main body and to be detachably attachable to the main body, first movement restricting means arranged to restrict a moving direction of the information storing part to a first direction in such a manner that the plurality of electrical contacts of the information storing part are loosely fitted on the plurality of electrical contacts of the main body in loading the information storing part on the main body, and second movement restricting means arranged to restrict the moving direction of the information storing part restricted by the first movement restricting means to a second direction which differs from the first direction in such a manner that the plurality of electrical contacts of the information storing part are brought into contact with the plurality of electrical contacts of the main body.

The above and other objects and features of this invention will become apparent from the following detailed description of embodiments thereof taken in conjunction with the accompanying drawings.

DETAILED DESCRIPTION OF THE PREFERRED EMBODIMENTS

Figure 1:
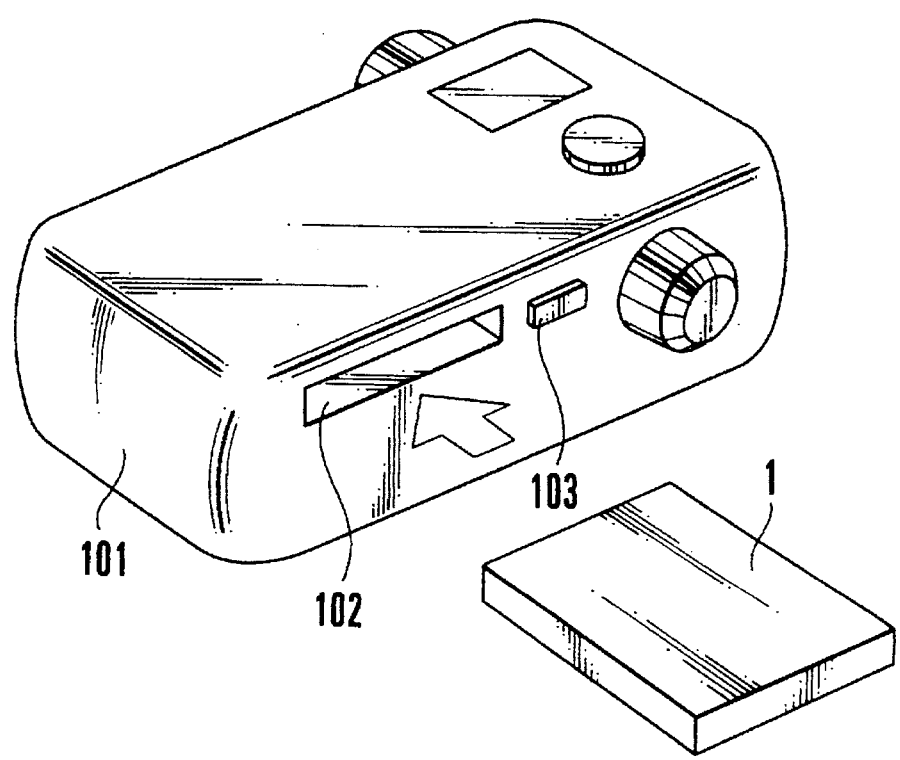
FIG. 1 is an oblique view showing an example of the conventional electronic still camera.
Figure 2:
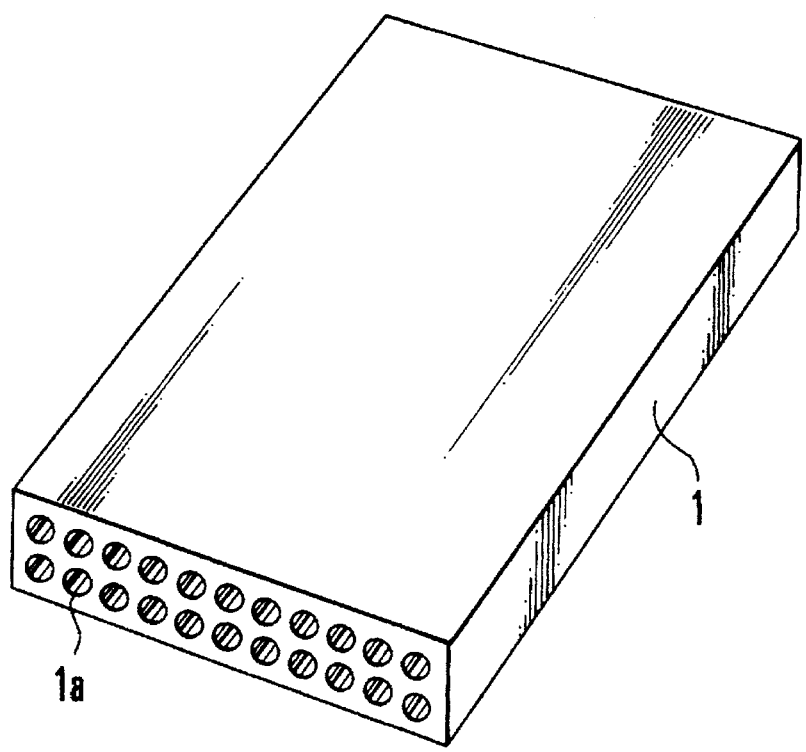
FIG. 2 is an oblique view showing the arrangement of the conventional memory card.
Figure 3:
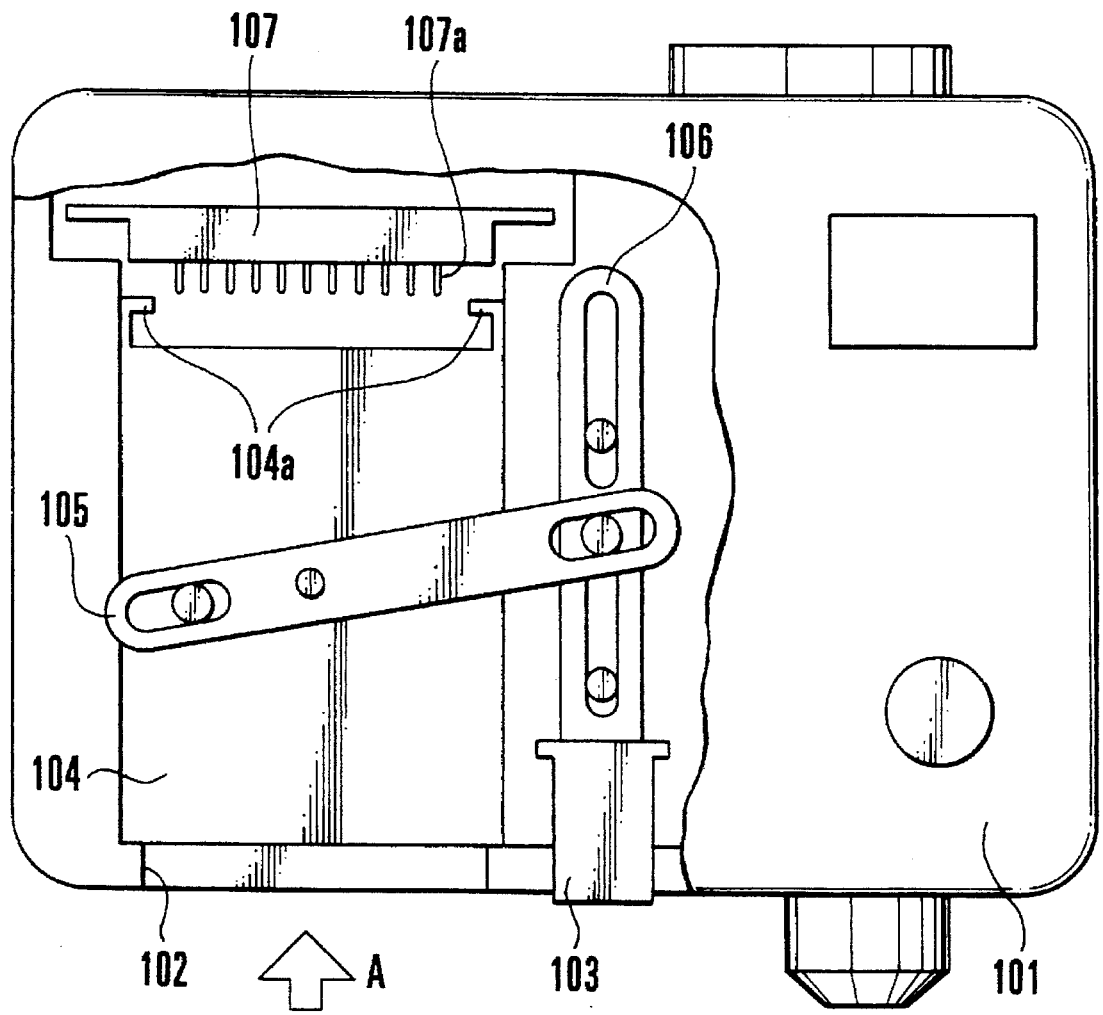
FIG. 3 is a plan view showing the conventional loading mechanism for loading the memory card.
Figure 3:
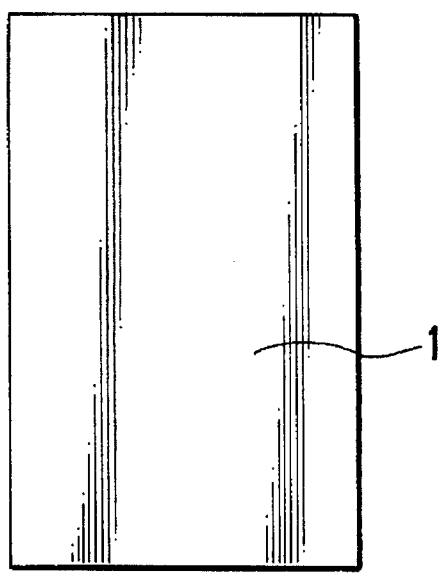
Figure 4:
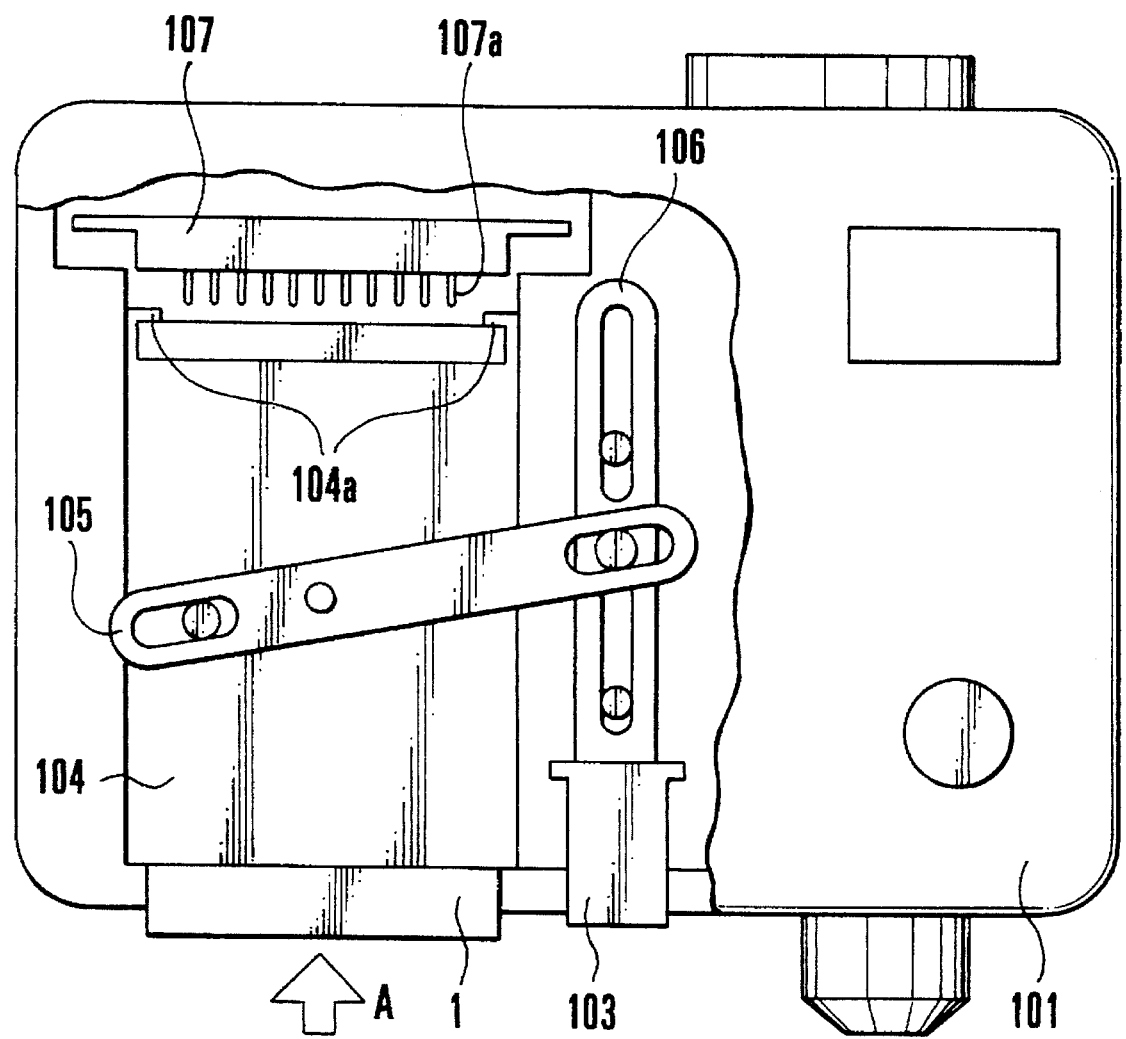
FIG. 4 is a plan view showing the conventional loading mechanism for loading the memory card.
Figure 5:
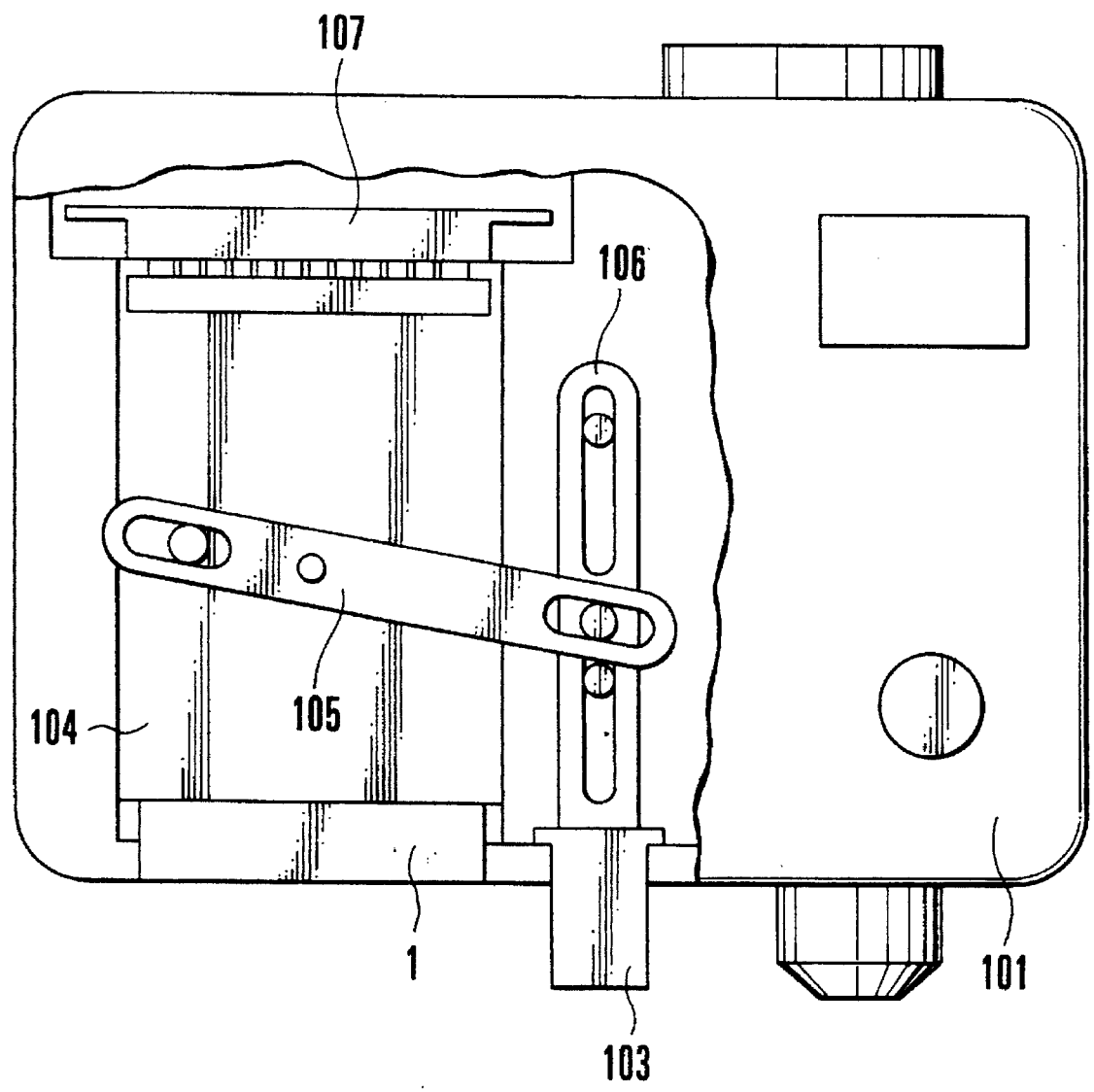
FIG. 5 is a plan view showing the conventional loading mechanism for loading the memory card.

The following describes this invention in detail through some of preferred embodiments thereof:

FIGS. 6 to 9 are side sectional views showing a memory card loading mechanism of an electronic still camera arranged according to this invention as a first embodiment thereof. Referring to FIGS. 6 to 9, a memory card 1 is arranged in the same manner as the memory card mentioned in the foregoing with reference to FIG. 1. The electronic still camera has a main body 2. A lid 3 is arranged to open and close in loading and unloading the memory card 1 and to be swingable on a shaft 4. A guide frame 5 is arranged to guide the memory card 1 and to be swingable on a shaft 15 which is secured to the main body 2 of the electronic still camera. A connector 6 has a group of signal pins 6a which are provided for exchange of signals between main body 2 and the memory card 1. A flexible printed circuit board 7 is provided for electrically connecting the group of signal pins 6a to an electronic circuit which is not shown but is arranged within the main body 2 of the electronic still camera. A slider 8 is provided for attaching and detaching the memory card 1 to and from the connector 6. The slider 8 has a slot 8a which engages an arm part 3a of the lid 3 and interference parts 8b and 8c which are arranged to interfere with the memory card 1. A leaf spring 9 is secured to the lid 3 at its one end and abuts on the guide frame 5 at the other end. An elastic member 10 is arranged to prevent dust, dewdrops or the like from entering the inside of the main body 2 of the electronic still camera. A lock lever 11 is arranged as will be described later. An eject lever 12 is connected directly to the lock lever 11.

Figure 6:
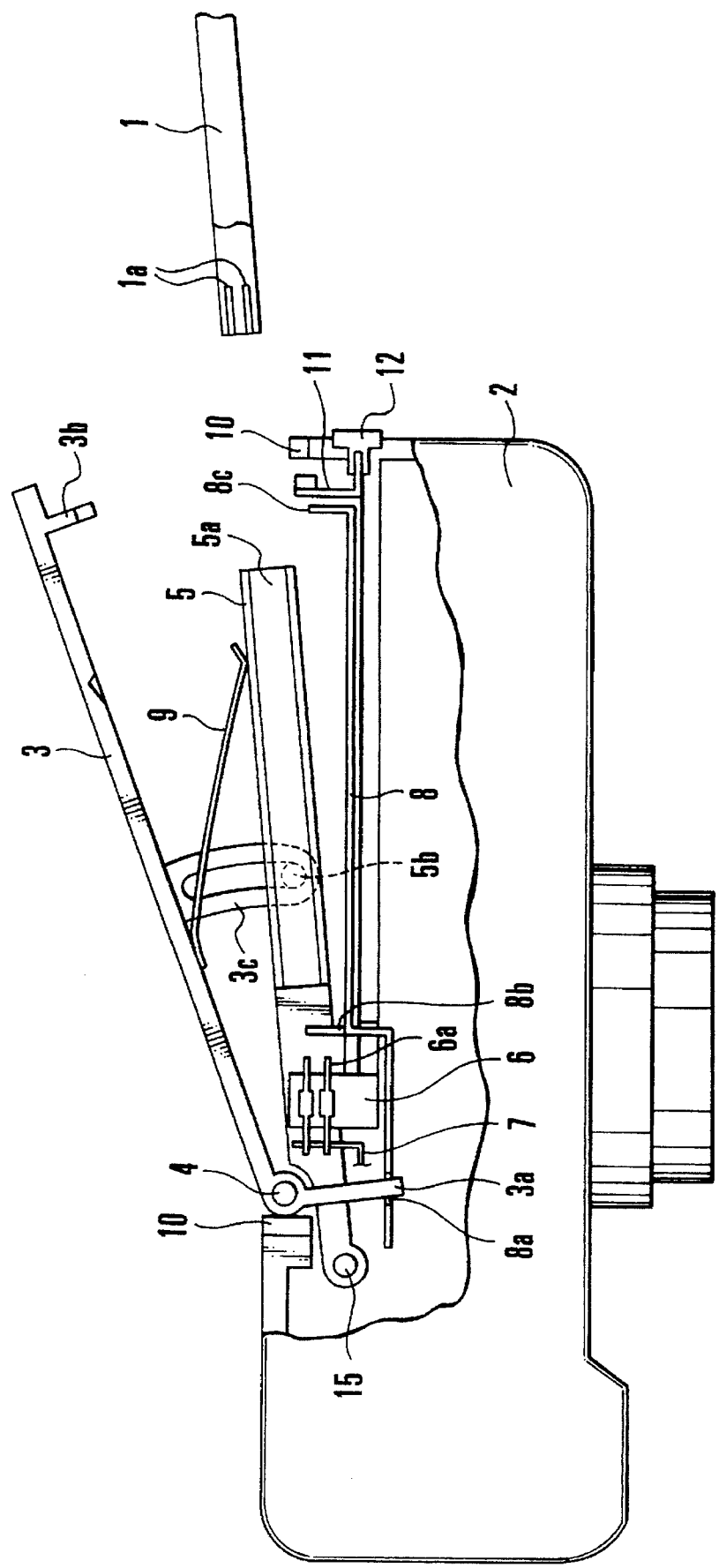
FIG. 6 is a sectional side view showing the memory card loading mechanism of an electronic still camera arranged as a first embodiment of this invention.
Figure 7:
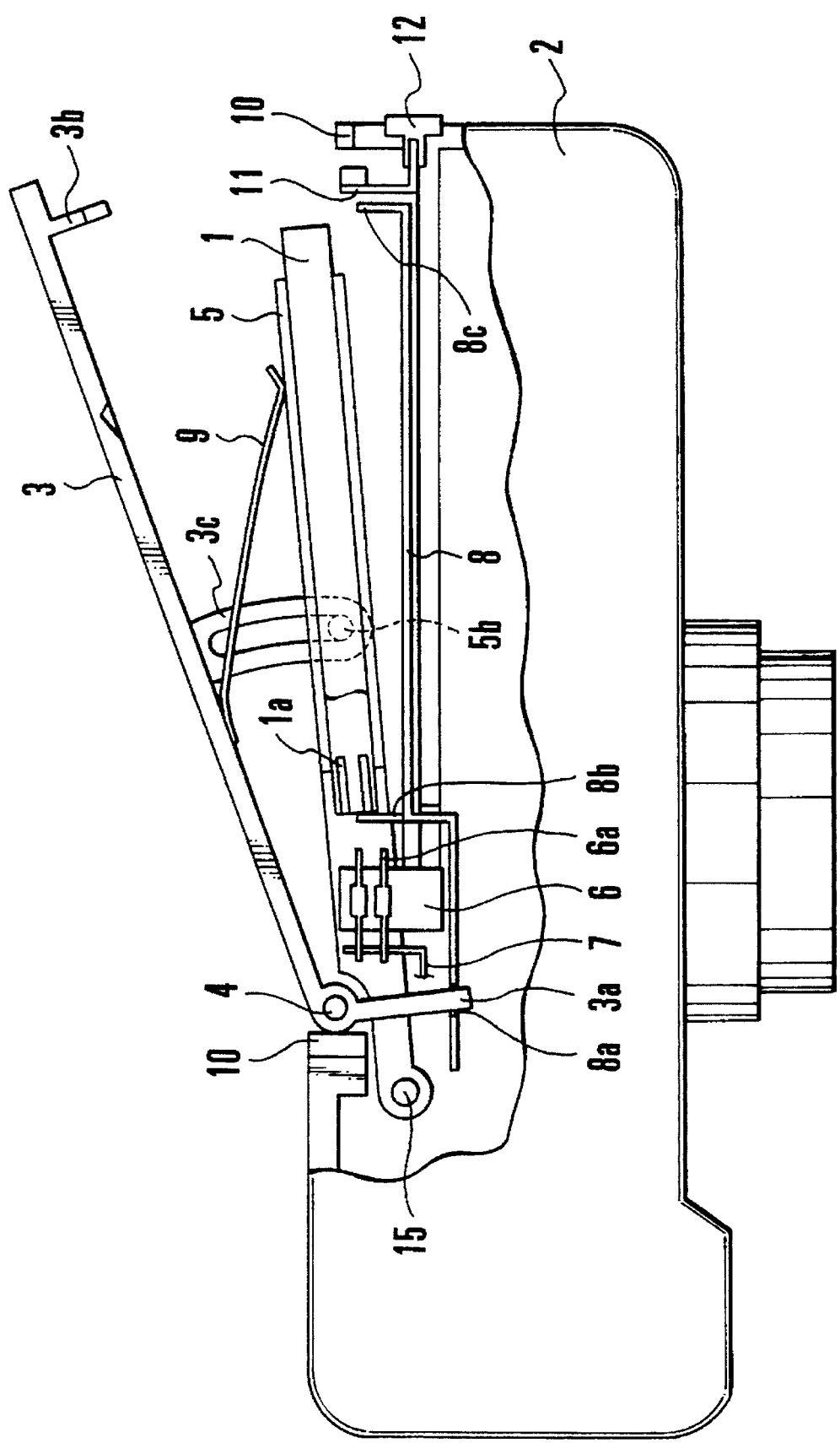
FIG. 7 is a sectional side view of the memory card loading mechanism of the electronic still camera arranged as the first embodiment of this invention.
Figure 8:
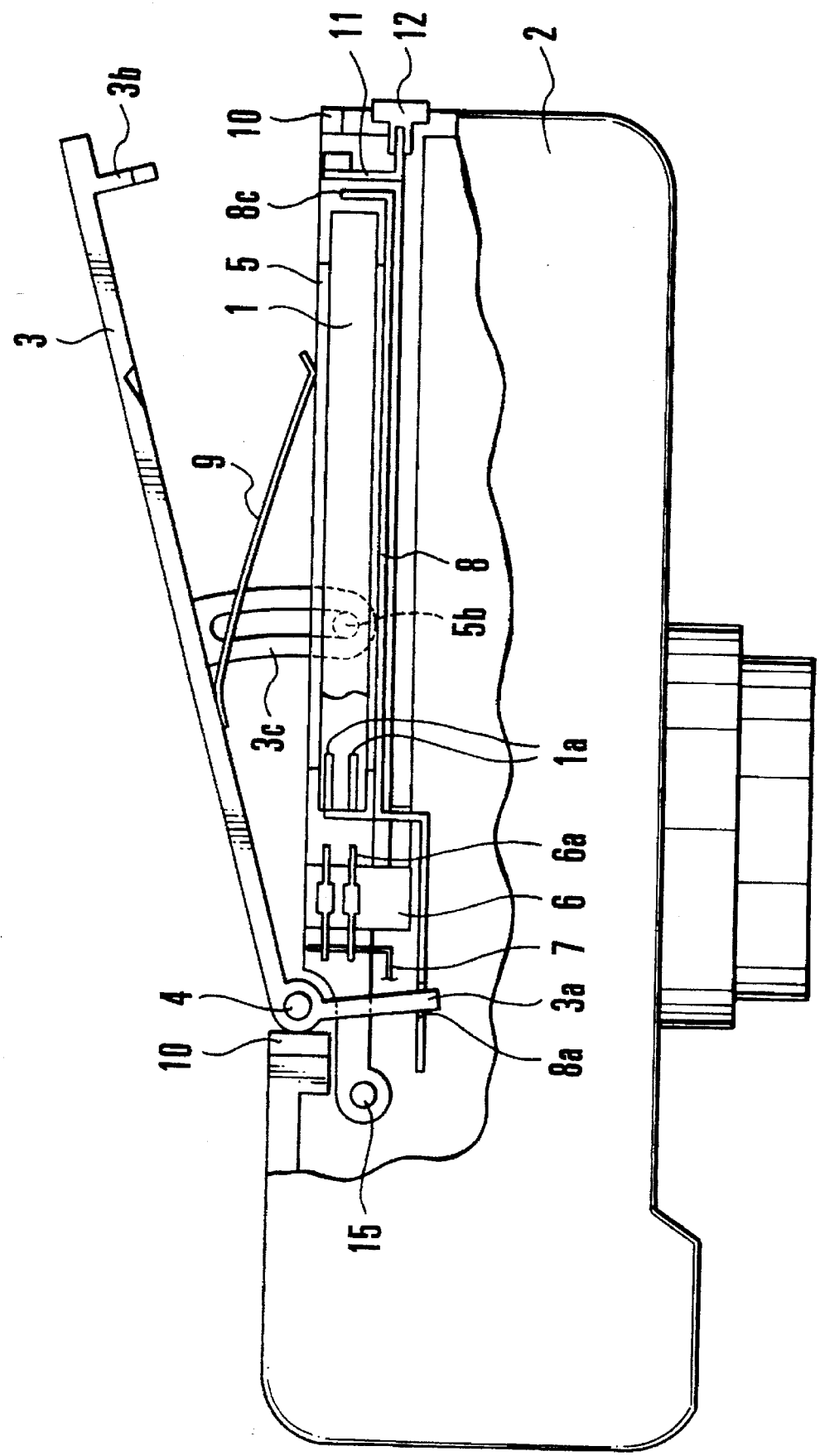
FIG. 8 is a sectional side view of the memory card loading mechanism of the electronic still camera arranged as the first embodiment of this invention.
Figure 9:
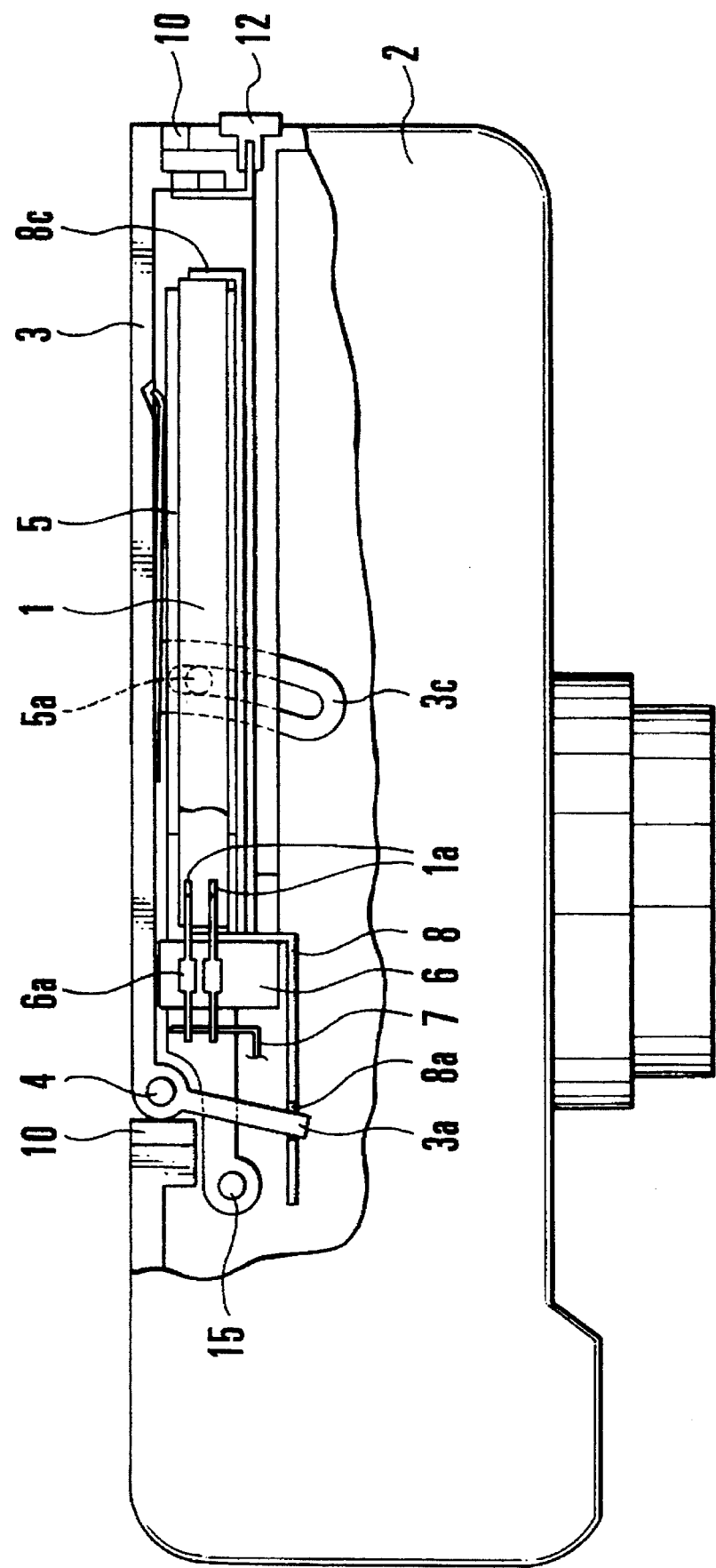
FIG. 9 is a sectional side view of the memory card loading mechanism of the electronic still camera arranged as the first embodiment of this invention.
Figure 10:
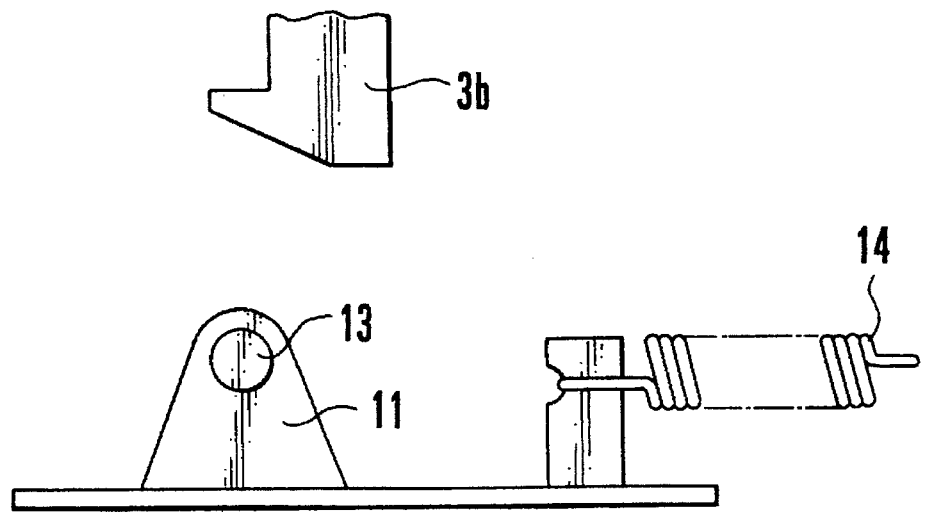
FIG. 10 shows a lock mechanism arranged to hold in a closed state a lid provided on the apparatus arranged as the first embodiment shown in FIGS. 6 to 9.
Figure 11:
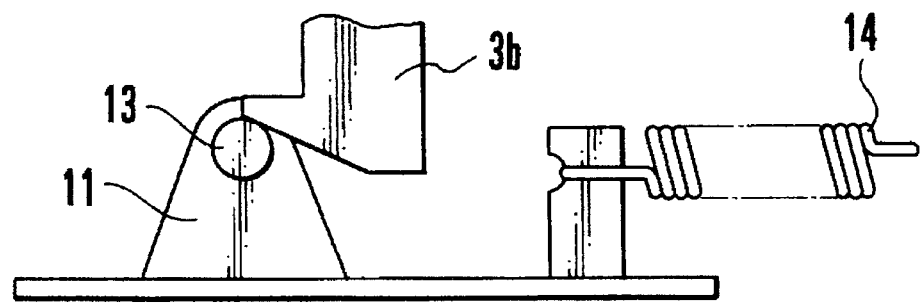
FIG. 11 shows the same lock mechanism arranged to hold the lid of the first embodiment in a closed state.
Figure 12:
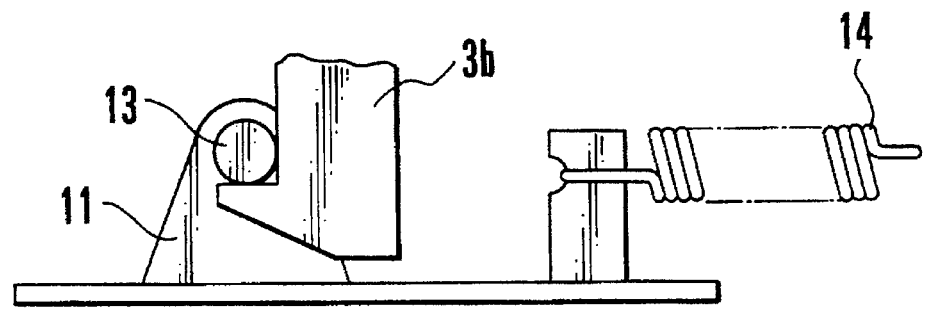
FIG. 12 shows the same lock mechanism arranged to hold the lid of the first embodiment in a closed state.

The memory card loading action of the first embodiment is described as follows: FIG. 6 shows the electronic still camera in a state of having the lid 3 open and the memory card 1 not loaded on the main body 2. In the state of FIG. 6, a pin 5b of the guide frame 5 interferes with an interlocking arm 3c of the lid 3 to cause the guide frame 5 to swing counterclockwise to have its inserting opening 5a protruding from the main body 2 of the electronic still camera. The memory card 1 thus can be inserted into the inserting opening 5a. FIG. 7 shows the electronic still camera in a state of having the memory card 1 completely inserted. During the process of inserting the memory card 1 into the inserting opening 5a of the guide frame 5, the foreend of the memory card 1 comes to interfere with the interfering part 8b of the slider 8 to prevent the memory card 1 from being further inserted. When the lid 3 is swung clockwise from its position shown in FIG. 7, the guide frame 5 also moves clockwise together with the memory card 1 to come into a state shown in FIG. 8. At this time, the slider 8 does not move because the arm part 3a of the lid 3 does not interfere with the slot 8a of the slider 8. When the lid 3 is swung further clockwise from its position shown in FIG. 8, the arm part 3a of the lid 3 comes to interfere with the slot 8a of the slider 8. The slider 8 then moves to the left, as viewed on the drawing, accordingly as the lid 3 is swung. The interference part 8c of the slider 8 then comes to interfere with the memory card 1 to push the memory card 1 to the left. The memory card 1 is thus caused to move to the left, as viewed on the drawing, along with the movement of the slider 8. When the lid 3 is completely closed, the group of contact holes 1a of the memory card 1 are fitted on the group of signal pins 6a of the connector 6. The memory card 1 is thus completely loaded on the main body 2 of the electronic still camera. FIG. 9 shows the electronic still camera in this state. As apparent from FIG. 9, when the lid 3 which functions as an operation member is closed, the elastic member 10 abuts on the lid 3 to give a dustproof and dripproof effect. FIGS. 10 to 12 show a lock mechanism arranged to keep the lid 3 which is an operation member in its closed state. In these drawings, reference numeral 11 denotes the lock lever mentioned above. Reference numeral 3b denotes an engaging pawl of the lid 3. Reference numeral 13 denotes a lock pin which is secured to the lock lever 11. Reference numeral 14 denotes a lock spring which is arranged to urge the lock lever 11 to the right as viewed on the drawings.

FIG. 10 shows the lock mechanism in a state obtained when the lid 3 is open. The engaging pawl 3b moves downward, as viewed on the drawings, accordingly as the lid 3 is moved toward its closed position. When the engaging pawl 3b comes to interfere with the lock pin 13 as shown in FIG. 11, the lock pin 13 moves to the left, as viewed on the drawings, together with the lock lever 11. When the lid 3 is completely closed, the lock pin 13 engages the engaging pawl 3b as shown in FIG. 12, so that the lid 3 can be kept in the closed state.

Next, the memory card ejecting action of the embodiment is described as follows: With the memory card 1 loaded on the electronic still camera as shown in FIG. 9, the lock lever 11 can be slid to the left, as viewed on the drawing, by operating the eject lever 12. Then, the engaging pawl 3b of the lid 3 is disengaged from the lock pin 13. A reaction force of the leaf spring 9 causes the lid 3 to swing counterclockwise. At this time, the arm part 3a of the lid 3 has not come to interfere with the slot 8a of the slider 8 as yet. Therefore, the slider 8 does not move. When the lid 3 swings further counterclockwise, the arm part 3a of the lid 3 comes to interfere with the slot 8a of the slider 8 to cause the slider 8 to move to the right according to the swing of the lid 3, as shown in FIG. 8. At that time, since the interference part 8b of the slider 8 is interfering with the memory card 1, the memory card 1 also moves to the right along with the slider 8. The memory card 1 is thus parted from the connector 6. After parting the memory card 1 from the connector 6, when the lid 3 is swung further counterclockwise, the interlocking arm 3c of the lid 3 comes to interfere with the pin 5a of the guide frame 5. This causes the guide frame 5 to move also counterclockwise together with the lid 3 to the position as shown in FIG. 7. In the state shown in FIG. 7, the memory card 1 can be pulled out by hand. After the memory card 1 is thus taken out, the lid 3 is closed again to bring the ejecting action to an end.

As described above, this embodiment is arranged to attach and detach the memory card 1 to and from the connector 6 in association with the movement of the lid 3 which is swingable and is included in a loading and unloading mechanism for the memory card of a so-called bucket type. Therefore, the leverage ratio between the interference part of the arm part 3a of the lid 3 and the swinging fore end of the lid 3 for the slider 8 can be increased without difficulty to lessen a force required for attaching and detaching the memory card 1 to and from the connector 6. Further, in the case of the embodiment, dust and dewdrops are not allowed to easily gather with the lid 3 closed. When the lid 3 is open, on the other hand, the lid 3 is unstable and seldom remains open, so that the dust and dewdrops can be effectively prevented from coming into the main body 2 of the electronic still camera.

Further, the electronic still camera may be arranged, as another embodiment of this invention, to have a switch which detects the opening and closing of the lid and a motor which drives the slider. In this case, the slider can be held in the position shown in FIG. 6 by the motor when the lid is open. When the lid is detected to be closed and the presence of the memory card is also detected, the slider is moved by the motor to the position shown in FIG. 9.

FIGS. 13 to 18 show an electronic still camera arranged as a second embodiment of this invention, a memory card to be connected to the electronic still camera and the connected states of them. In FIGS. 13 to 18, parts which are either the same or having the same functions as those shown in FIGS. 6 to 9 are indicated by the same reference numerals, and details of them are omitted from the following description.

Referring to FIGS. 13 to 18, the electronic still camera is provided with an inserting opening 2a for loading the memory card 1. A connector 23 is arranged in the electronic still camera for electrical communication with the memory card 1. The connector 23 is provided with a group of signal pins 23a. A pushing member 24 is arranged to cause the memory card 1 to move to the left, as viewed on the drawings, when the memory card 1 is inserted into the main body 2 of the electronic still camera. A pushing spring 25 is arranged to urge the pushing member 24 to move to the left, as viewed on the drawings. An operation member 26 is arranged to be operable from outside of the main body 2 of the electronic still camera to cause the pushing member 24 to move to the right, as viewed on the drawings. A lock lever 28 is arranged to hold the pushing member 24 in a predetermined position and has an engaging part 28a which engages a pin 24a provided on the pushing member 24 and an interlocking part 28b which will be described later. A spring 29 is arranged to urge the lock lever 28 downward as viewed on the drawings. An interference pin 30 interferes with the inserting fore end of the memory card 1 at its one end and also interferes with the interlocking part 28b of the lock lever 28 at the other end. A guide pin 31 is secured to the main body 2 of the electronic still camera and slidably engages a slot part 28c of the lock lever 28 to guide the movement of the lock lever 28. A return member 32 is arranged to return the memory card 1 by moving it to the right as viewed on the drawings. A return spring 33 urges the return member 32 to the right, as viewed on the drawings, with an urging force which is weaker than the force of the above-stated pushing spring 25. An eject lever 34 is provided for ejecting the memory card 1 and has a bent part 34a which is arranged to engage the inserting fore end of the memory card 1. The eject lever 34 is slidable vertically as viewed on the drawings. A spring 35 is arranged to urge the eject lever 34 to move vertically as viewed on the drawings.

Figure 17:
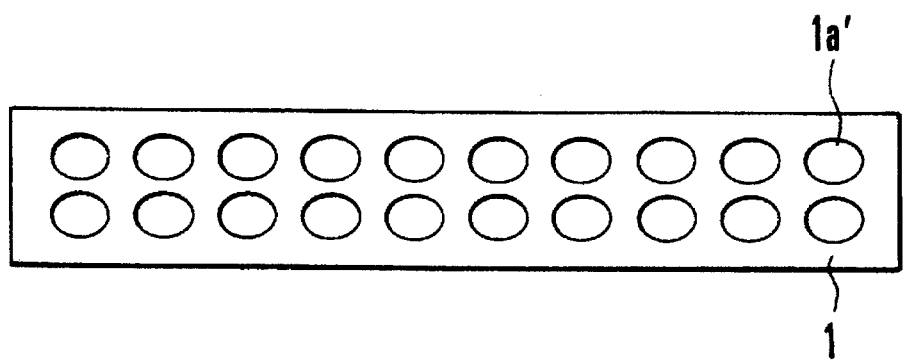
FIG. 17 shows contacts arranged in the memory card of the second embodiment shown in FIGS. 13 to 16.
Figure 18:
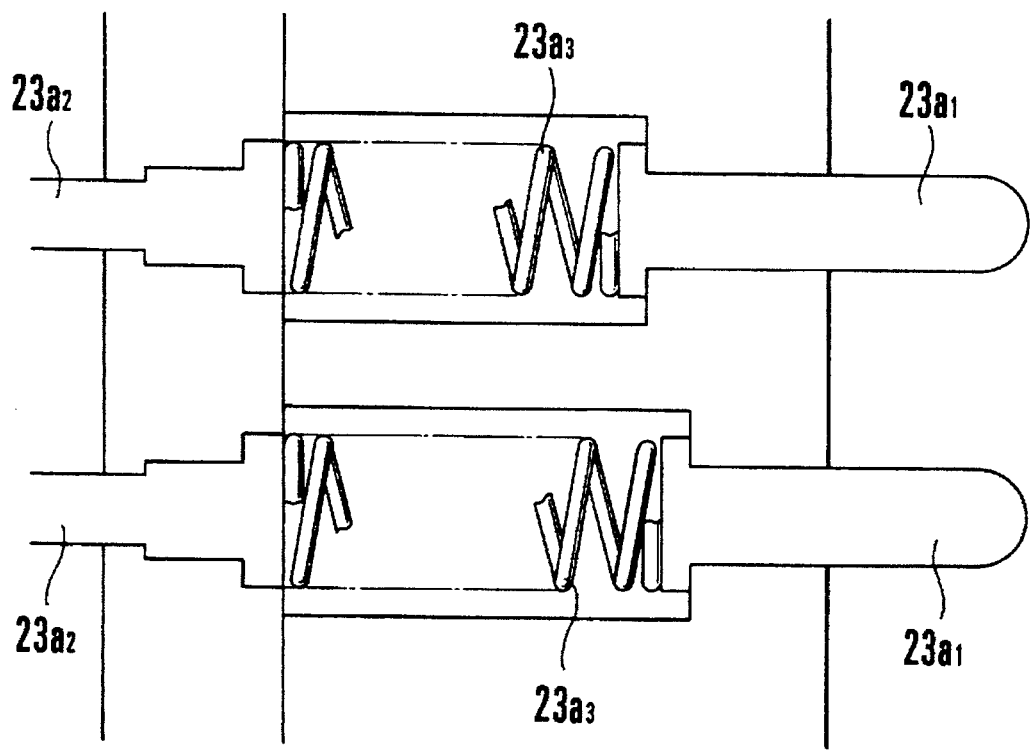
FIG. 18 is a sectional view showing the internal arrangement of a connector of the electronic still camera arranged as the second embodiment shown in FIGS. 13 to 16.

FIG. 17 is a front view of the group of contacts 1a' of the memory card 1. Each of the contacts 1a' is in an laterally oblong elliptic shape. FIG. 18 shows the inside structure of the connector 23. Referring to FIG. 18, the group of signal pins 23a includes movable signal pins 23a1, fixed signal pins 23a2 and contact springs 23a3. Each of the contact springs 23a3 is arranged not only to electrically connect the movable signal pin 23a1 with the fixed signal pin 23a2 but also to exert an urging force on the movable signal pin 23a1.

Figure 13:
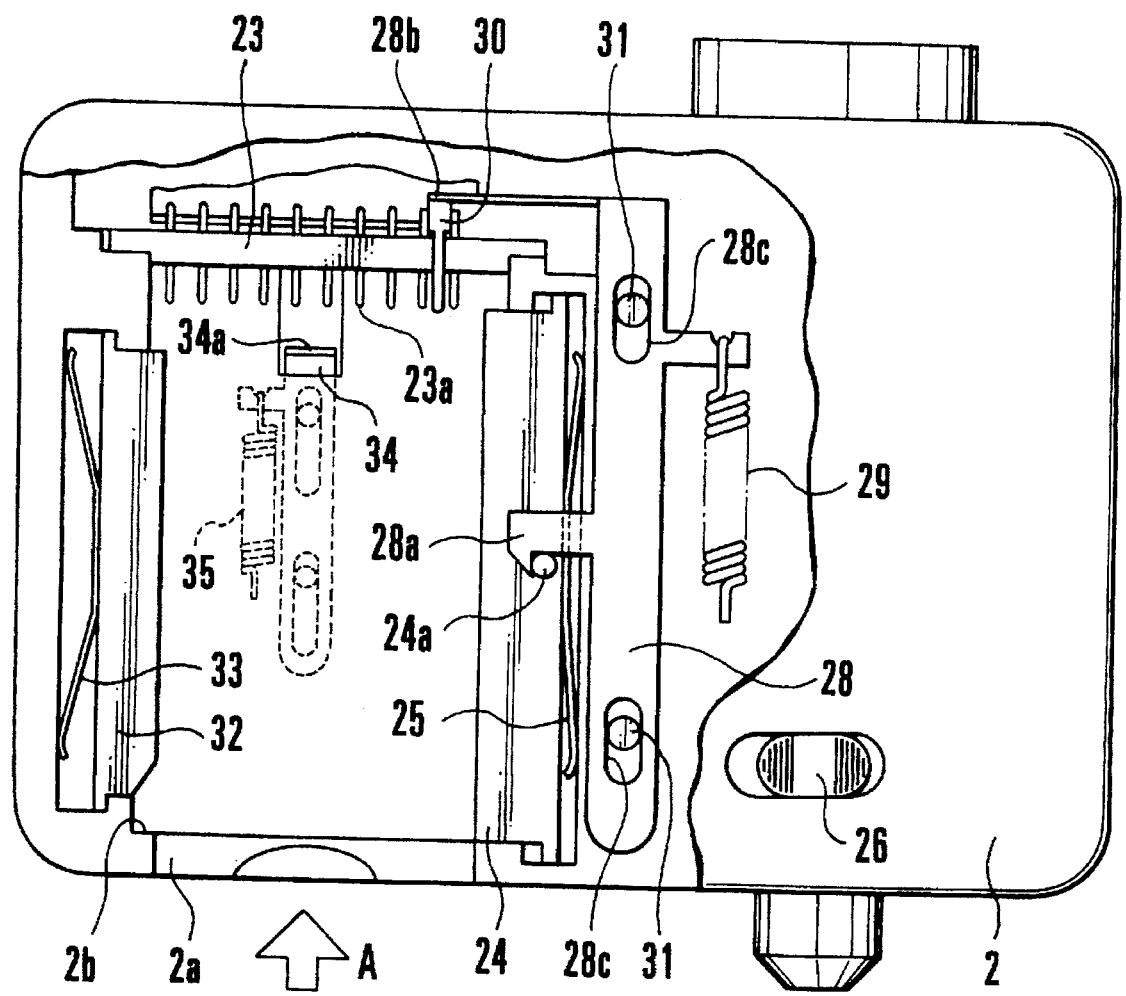
FIG. 13 is a plan view showing the inside of the memory card loading part of an electronic still camera arranged as a second embodiment of this invention.
Figure 13:
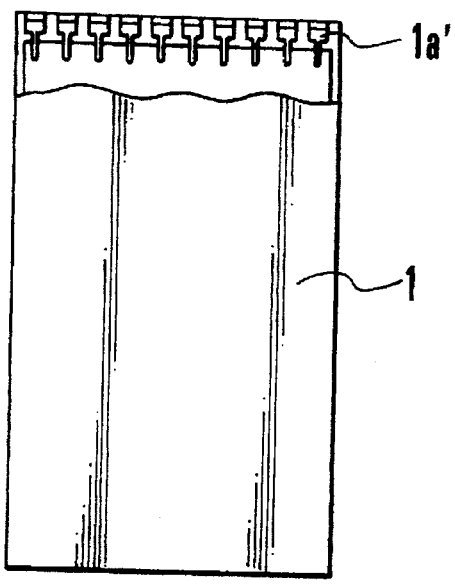
Figure 14:
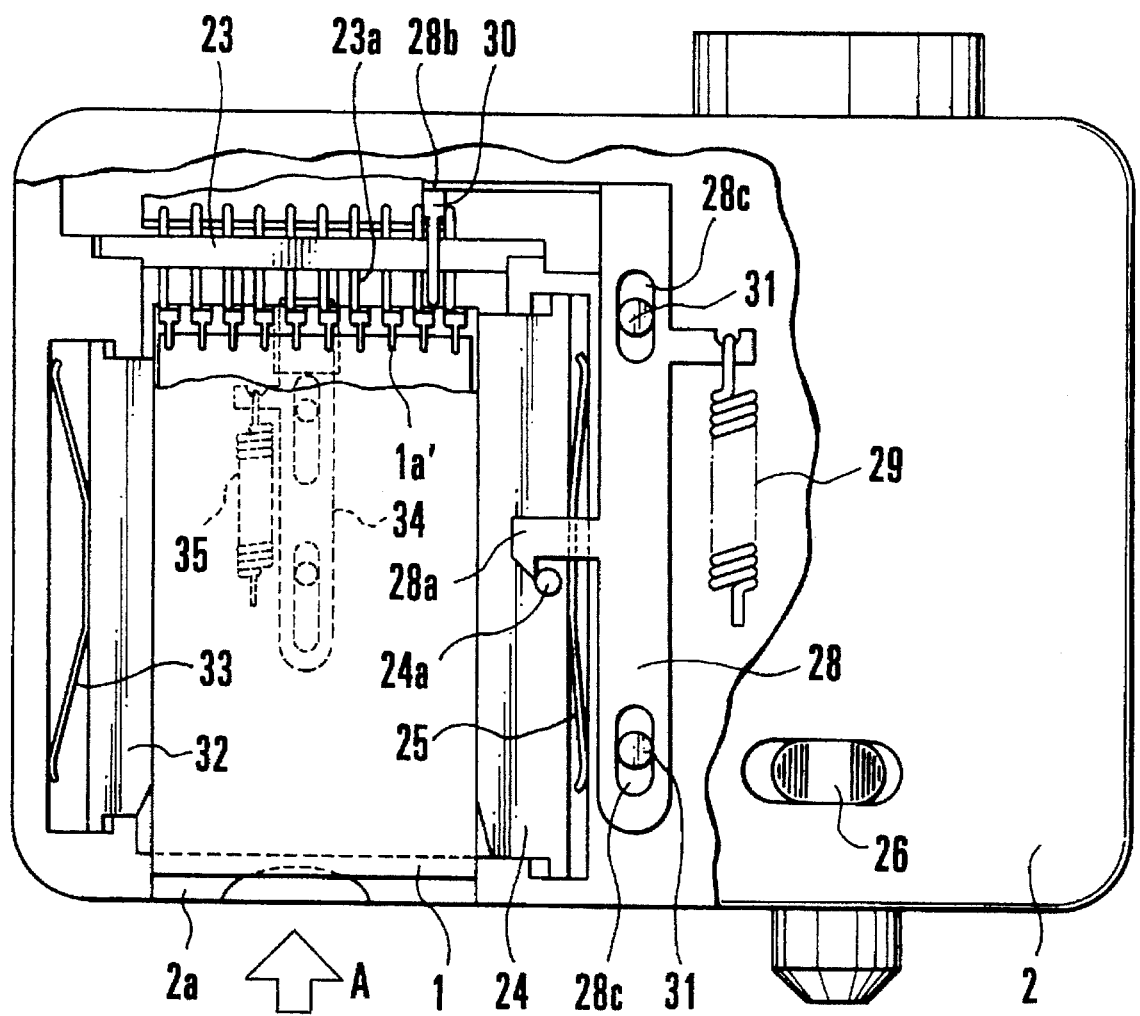
FIG. 14 is a plan view showing the inside of the memory card loading part of the electronic still camera arranged as the second embodiment of this invention.
Figure 15:
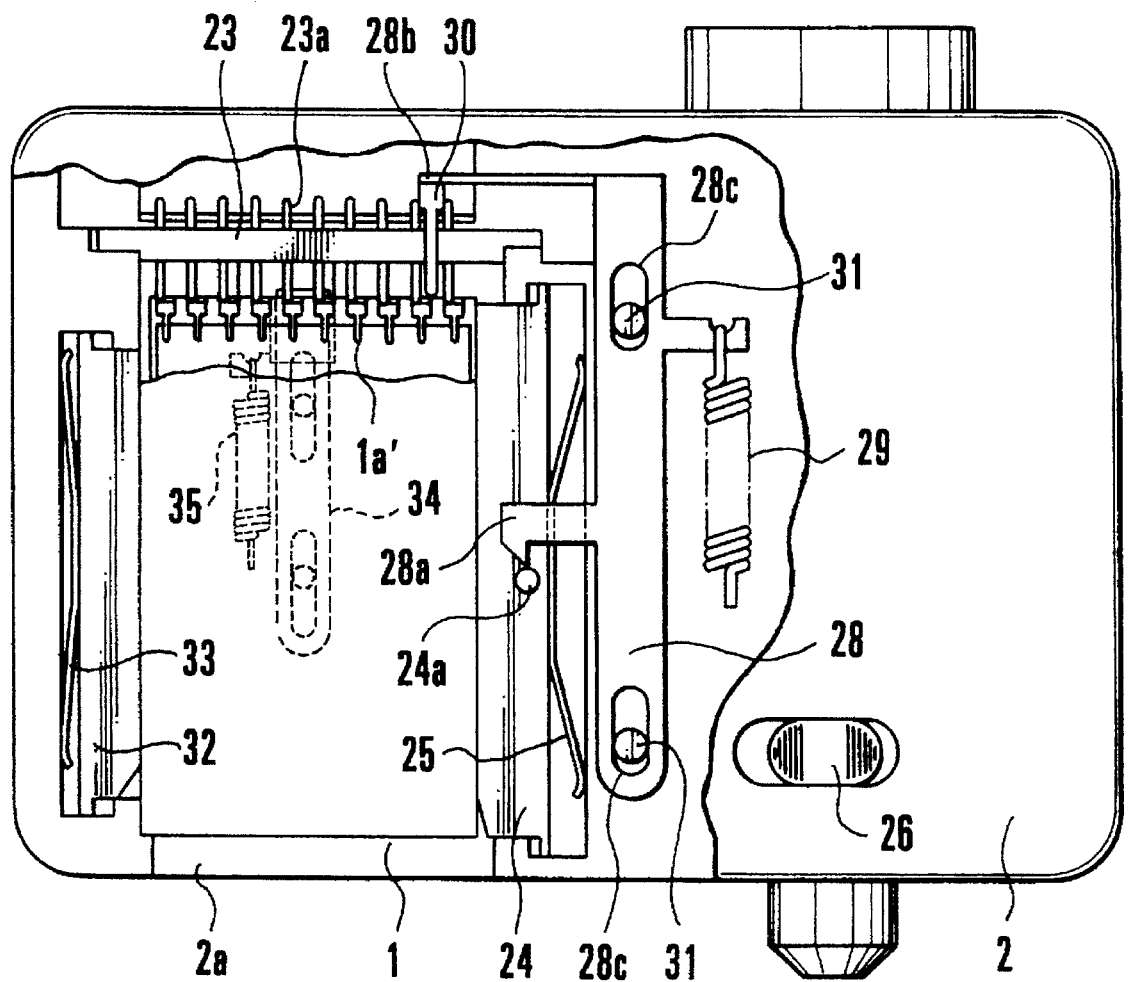
FIG. 15 is a plan view showing the inside of the memory card loading part of the electronic still camera arranged as the second embodiment of this invention.
Figure 16:
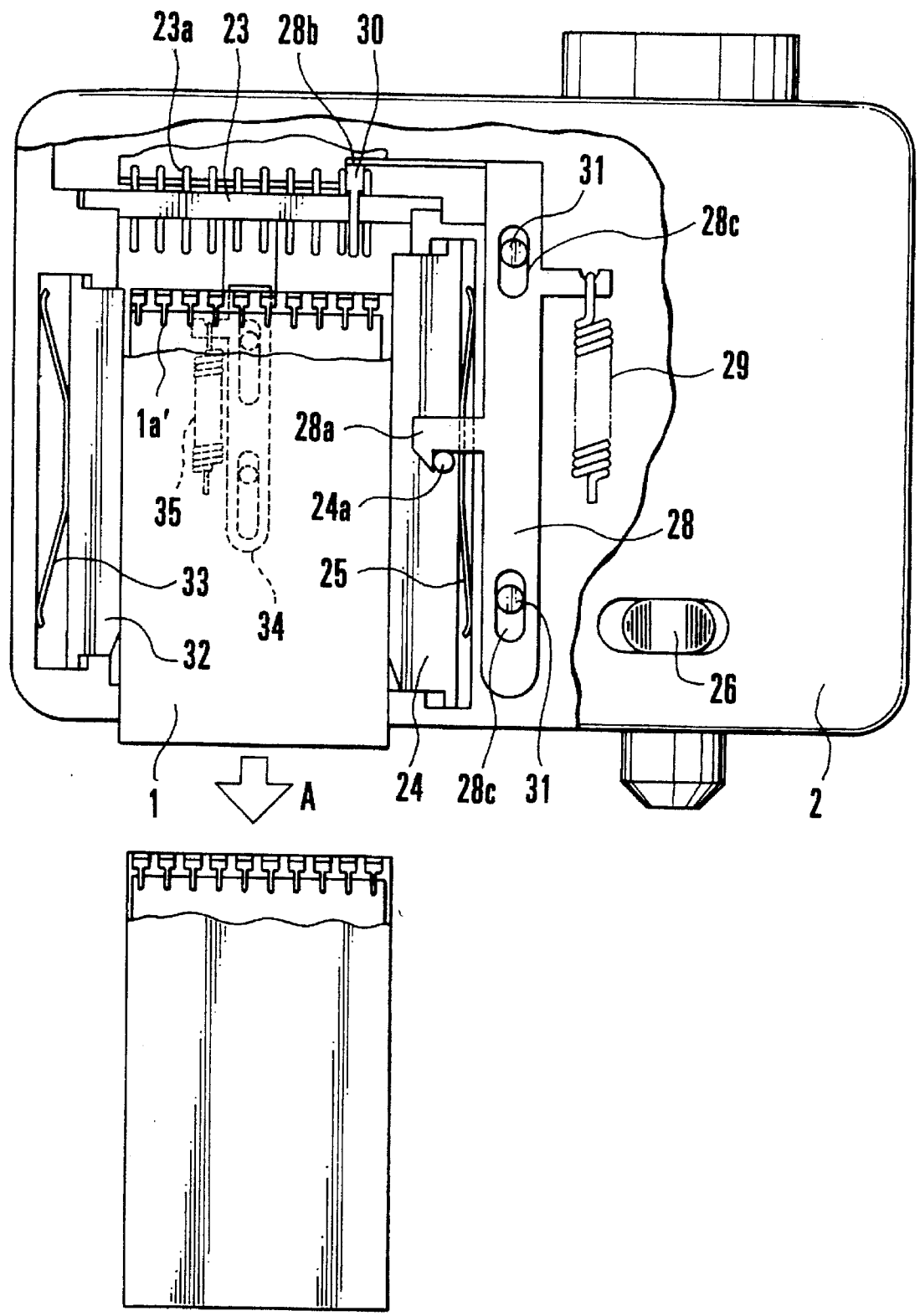
FIG. 16 is a plan view showing the inside of the memory card loading part of the electronic still camera arranged as the second embodiment of this invention.

The second embodiment operates as follows: FIG. 13 shows the embodiment in a state of not having the memory card 1 loaded on the main body 2 of the electronic still camera. When the memory card 1 comes to be inserted into the inserting opening 2a of the main body 2 of the electronic still camera in the direction of arrow A, the eject lever 34 first comes to interfere with the memory card 1. The eject lever 34 then moves together with the memory card 1 in the direction of arrow A. Next, as shown in FIG. 14, the group of contacts 1a' of the memory card 1 abuts on the group of signal pins 23a of the connector 23. At this moment, the interference pin 30 also abuts on the memory card 1. This causes the lock lever 28 to begin to move also in the direction of arrow A. When the memory card 1 is inserted further to come from the position of FIG. 14 to a position shown in FIG. 15, the engaging part 28a of the lock lever 28 disengages from the engaging pin 24a of the pushing member 24. The urging force of the pushing spring 25 then causes the pushing member 24 to move to the left, as viewed on the drawing. The pushing member 24 then abuts on an abutting part of the main body 2 of the electronic still camera to come to a stop. Then, since the urging force of the return spring 33 which urges the return member 32 to the right as viewed on the drawing is weaker than the urging force of the pushing spring 25, the return member 32 also moves together with the memory card 1 to the left as viewed on the drawing. At that time, since the moving amount of the memory card 1 is sufficiently shorter than the longitudinal dimension of the group of contacts 1a' of the memory card 1, the group of contacts 1a' can be always brought into contact with the group of corresponding signal pins 23a of the connector 23. At this time, the memory card 1 is urged to move in a direction reverse to the direction of arrow A by the eject lever 34. However, the memory card 1 is detained by a recessed part 2b formed on the inner side of the inserting opening 2a of the main body 2 of the electronic still camera. The memory card 1 is thus prevented from being accidentally ejected from the inserting opening 2a.

The ejecting action on the memory card 1 is described as follows: When the operation member 26 is moved from its position shown in FIG. 15 to the right, as viewed on the drawing, the pushing member 24 is caused to move also to the right. The return member 32 then causes the memory card 1 to move to the right, as viewed on the drawing, by the urging force of the return spring 33. The memory card 1 is then disengaged from the recessed part 2b mentioned above to be ejected from the inserting opening 2a by the eject lever 34. With the memory card 1 ejected, the interference pin 30 no longer interferes with the memory card 1. Therefore, the urging force of the spring 29 causes the engaging lever 28 to move downward, as viewed on the drawing. Then, the engaging part 28a of the engaging lever 28 again engages the engaging pin 24a of the pushing member 24 to bring about the state of FIG. 16. The memory card ejecting action thus comes to and end.

With the embodiment arranged to operate as described above, the contacts can be prevented from wearing away, and the memory card can be locked and unlocked by just sliding the memory card. The mechanism of the electronic, still camera thus can be simplified in accordance with the arrangement described.

Figure 19:
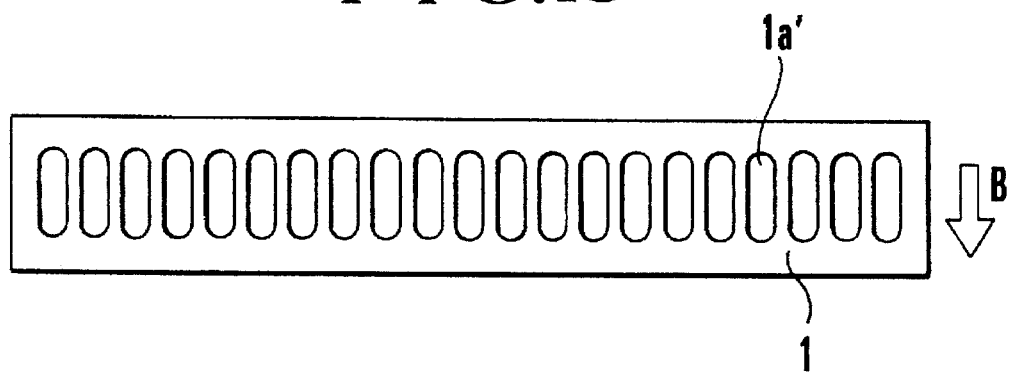
FIG. 19 shows contacts arranged in the memory card of another embodiment of this invention.

The shape of the group of contacts 1a' of the memory card 1 may be changed as shown in FIG. 19, and the sliding direction in which the memory card 1 is inserted into the electronic still camera may be changed to the direction of arrow B.

FIGS. 20 to 23 show an electronic still camera arranged as a third embodiment of this invention. The third embodiment differs from the second embodiment in that the return member 32 and the return spring 33 of the second embodiment are replaced with a frame 36 which is secured to the pushing member 24. With the exception of this point, the arrangement of the third embodiment is identical with that of the second embodiment.

Figure 20:
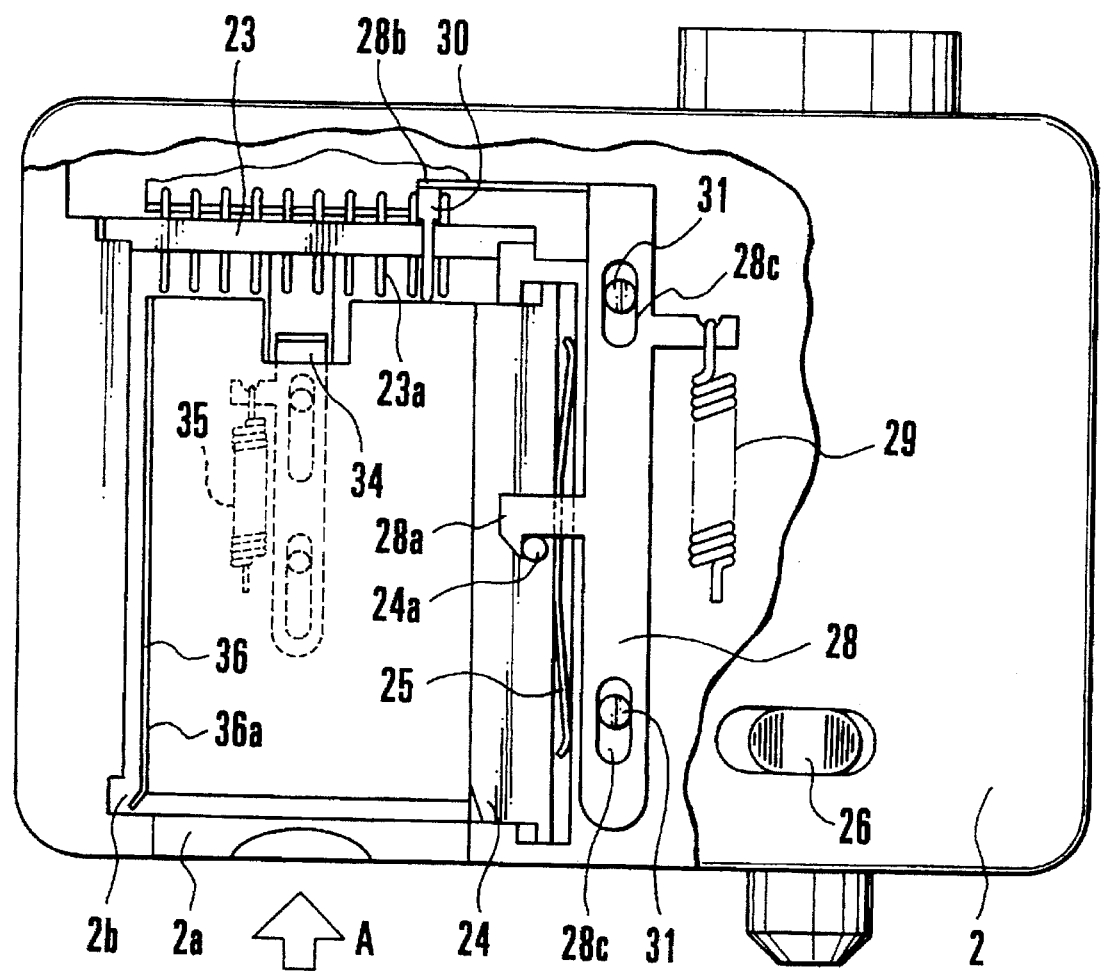
FIG. 20 is a plan view showing the inside of the memory card loading part of an electronic still camera arranged as a third embodiment of this invention.
Figure 20:
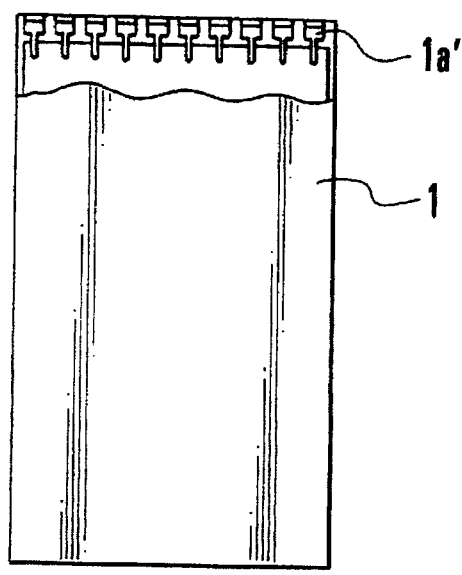
Figure 21:
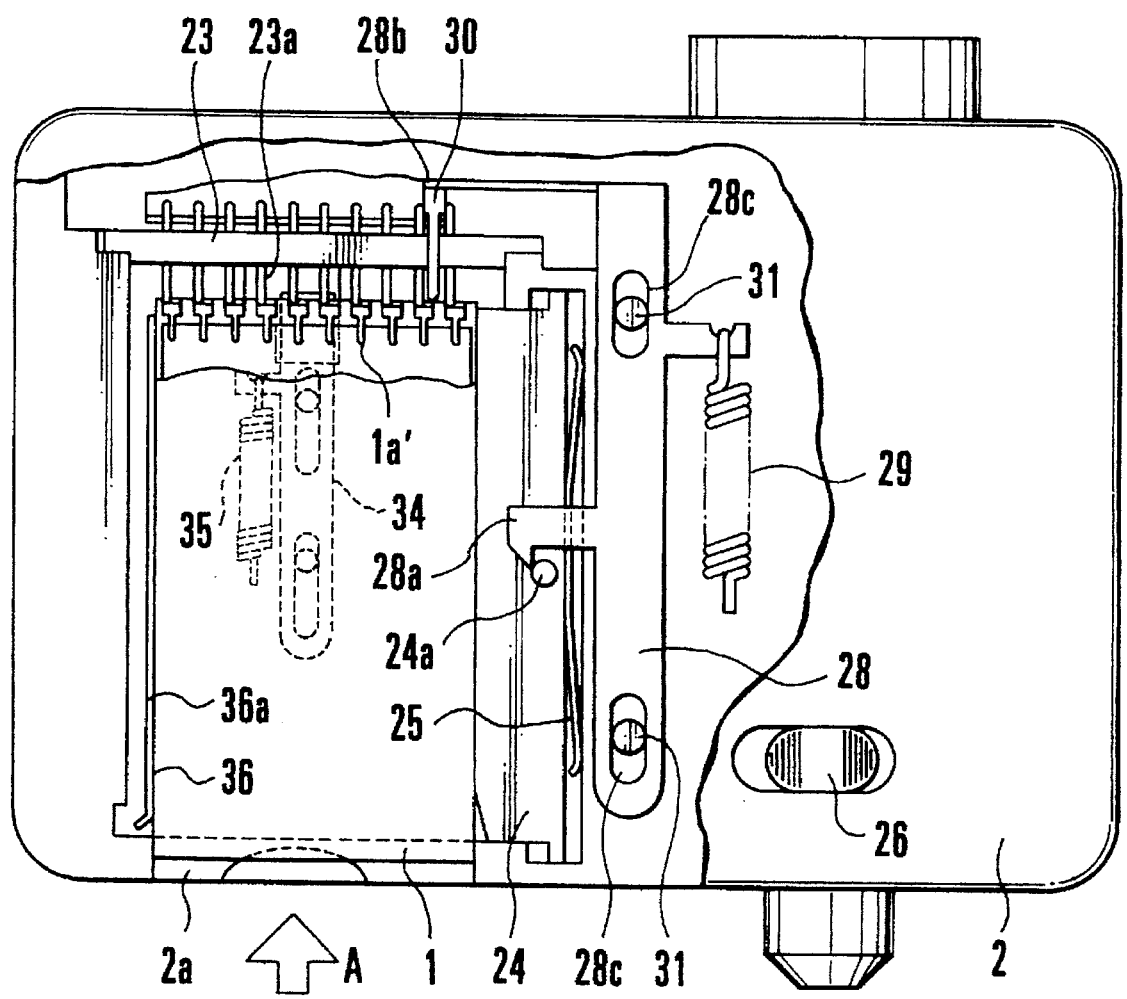
FIG. 21 is a plan view showing the inside of the memory card loading part of the electronic still camera arranged as the third embodiment of this invention.
Figure 22:
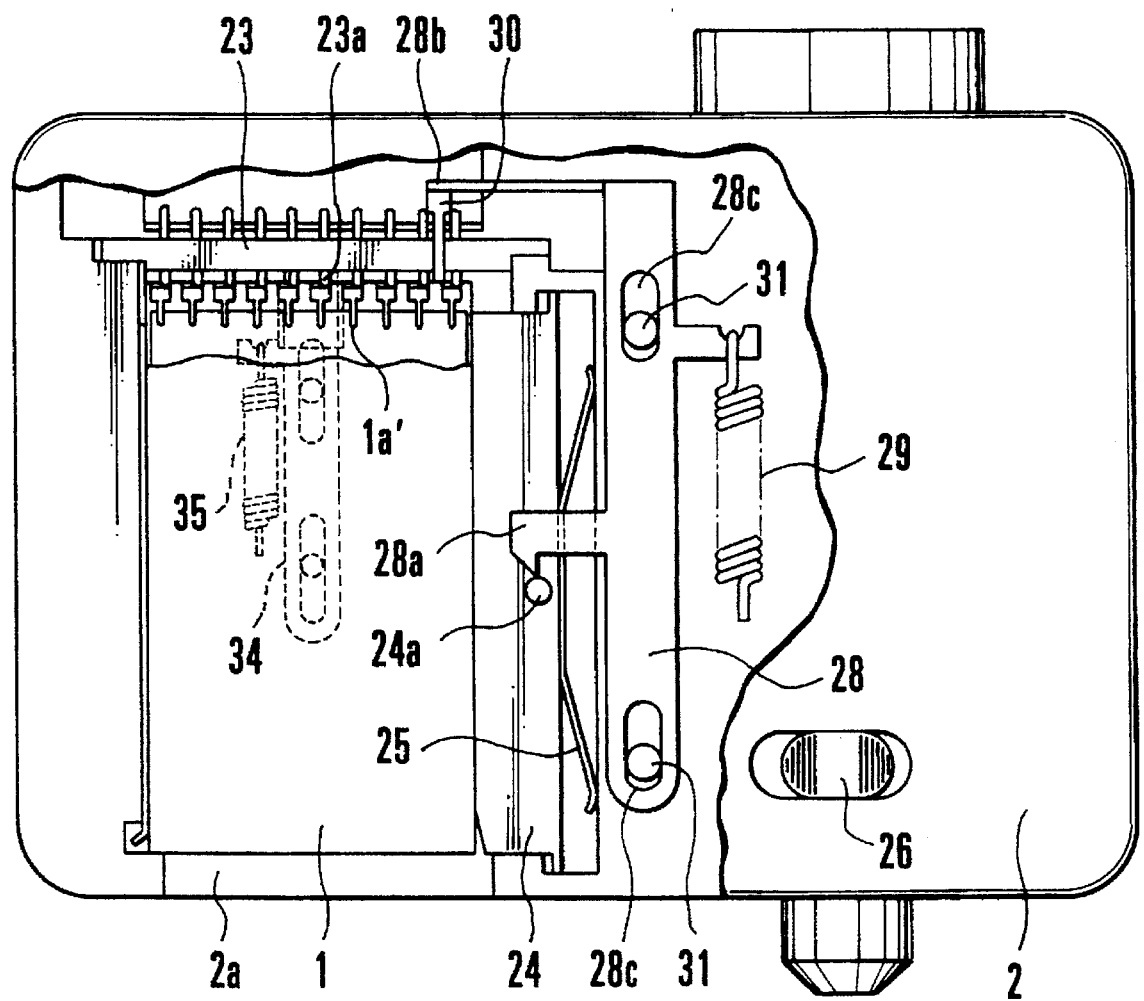
FIG. 22 is a plan view showing the inside of the memory card loading part of the electronic still camera arranged as the third embodiment of this invention.
Figure 23:
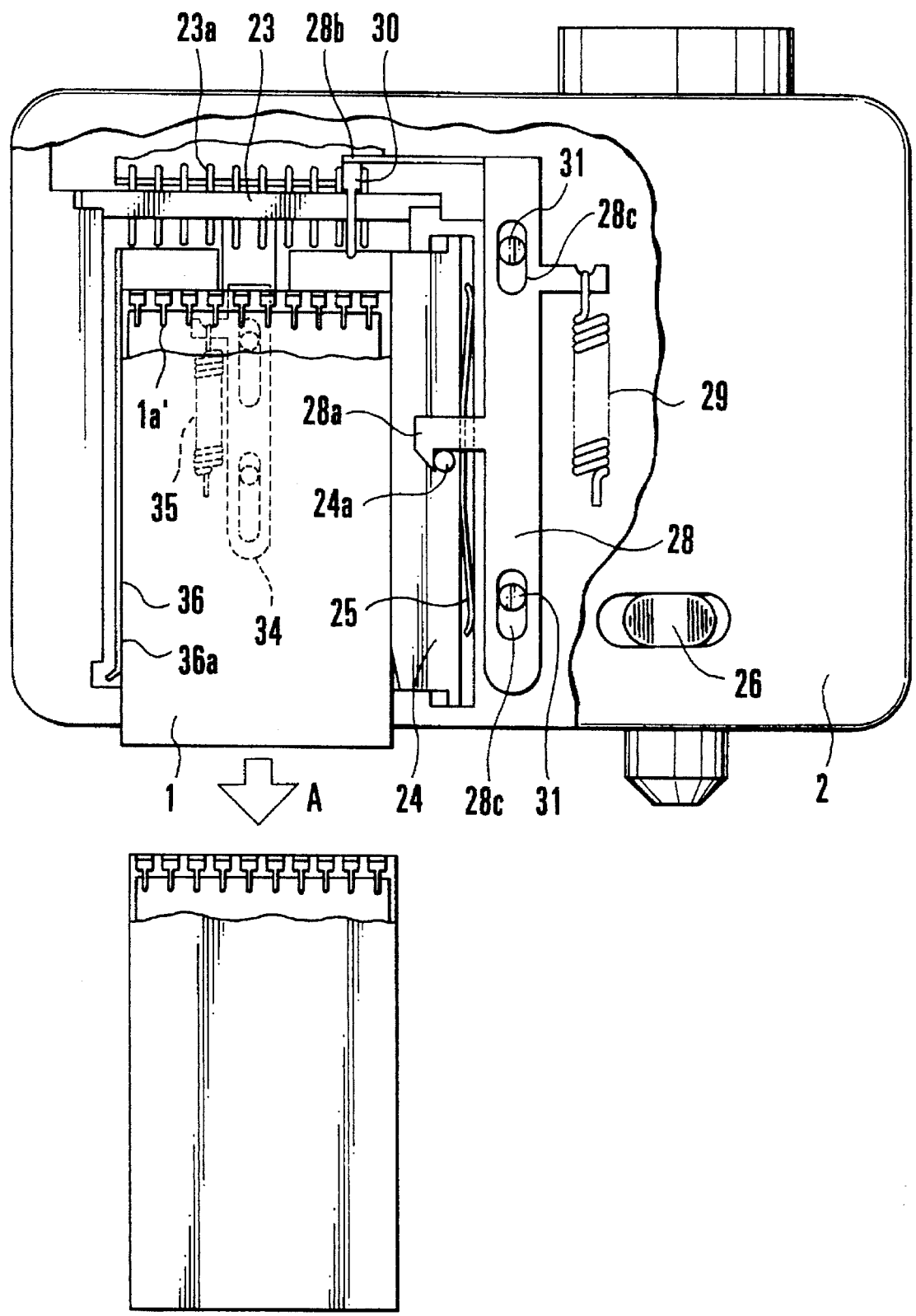
FIG. 23 is a plan view showing the inside of the memory card loading part of the electronic still camera arranged as the third embodiment of this invention.

The operation of the third embodiment is briefly described as follows: FIG. 20 shows the electronic still camera in a state of having the memory card 1 not loaded on the electronic still camera. When the memory card 1 comes to be inserted in the direction of arrow A, the state of the embodiment changes from the state of FIG. 20 to a state of having the memory card 1 completely loaded on the main body 2 of the electronic still camera as shown in FIG. 22 through a state shown in FIG. 21. In rejecting the memory card 1, the operation member 26 is moved to the right as viewed on the drawing. The frame 36 then moves to the right, as viewed on the drawing, together with the pushing member 24. Since the frame 36 interferes with the memory card 1 at a bent part 36a thereof, the memory card 1 also moves to the right. When the inserting opening 2a of the main body 2 of the electronic still camera comes to no longer interfere with the memory card 1, the memory card 1 is ejected by the eject lever 34 as shown in FIG. 23, so that the memory card 1 can be taken out.

The arrangement of the third embodiment permits the electronic still camera to have a simpler mechanism than the second embodiment because the memory card 1 is arranged to be ejected through the frame 36 which is secured to the pushing member 24.

Each of the embodiments described is provided with an operation member for causing a slider to slide along with the memory card in the direction of attaching or detaching the memory card to and from the connector disposed on the side of the electronic still camera. The slider operates in response to the operation member to enable the memory card to be loaded and unloaded on and from the electronic still camera. The embodiment is thus arranged to have the memory card not operated directly by hand in attaching and detaching the memory card to and from the connector of the electronic still camera. The memory card, therefore, can be reliably attached to and detached from the connector of the electronic still camera without damaging the connector, etc.

Further, the slider is arranged to act also as a restricting member for restricting the inserting amount of the memory card inserting action in loading the memory card on the electronic still camera. The memory card loading mechanism, therefore, can be simplified.

Another advantage of the embodiment lies in that, the above-stated operation member is arranged to serve as a lid for opening and closing the memory card loading mechanism. The lid is arranged such that the memory card disengages and parts from the connector when the lid is open and is connected to the connector when the lid is closed. Therefore, the loading mechanism can be opened and closed at the same time that the memory card is attached and detached to and from the connector.

A further advantage of the embodiment lies in the following point: The connector is arranged on the side of the electronic still camera to have the group of signal pins urged by springs as contacts for electrically connecting the memory card to the electronic still camera. The electrical connection is effected by bringing the group of signal pins into contact with the group of contacts arranged on the side of the memory card. The arrangement enables the memory card to be loaded and unloaded with a small force, so that the operability of the embodiment in loading and unloading the memory card can be enhanced.

Further, the embodiment is arranged to have the group of contacts of the memory card in a laterally oblong shape and, in loading the memory card on the electronic still camera, to slide the memory card in the longitudinal direction of the memory card after the group of contacts of the memory card comes to abut on the group of signal pins of the connector on the side of the electronic still camera. This arrangement eliminates the possibility of inadequate contact which has been a shortcoming of the contacts of this kind. Further, with the memory card arranged to be slid, it is possible to inform the operator of completion of a memory card loading action on the electronic still camera.

What is claimed is:

1. An image pick-up apparatus usable with an information storing device having a plurality of electrical contacts which are connectable with a plurality of electrical contacts of a main body of said apparatus and to be detachably attachable to said main body, comprising:
    a) a first moving member arranged to carry said information storing device and to be movable between a first position and a second position in a direction different from a direction in which the information storing device is loaded in the main body, the information storing device being loadable in the main body when said moving member is in the first position; and
    b) a second moving member arranged to be movable between a third position and a fourth position while said first moving member remains in the second position, and the plurality of electrical contacts of said information storing device are not connected to the plurality of electrical contacts of said main body when said second moving member is in the third position and are connected to the plurality of electrical contacts of said main body when said second moving member is in the fourth position.

2. An apparatus according to claim 1, further comprising a lid member which can be opened and closed for exposing and shielding said information storing device carried by said first moving member.

3. An apparatus according to claim 1, wherein the plurality of electrical contacts of said main body include conductive members which are arranged to be urged by an urging member respectively and to be displaceable in a direction in which the information storing device moves in the main body and to electrically connect said main body with said information storing device.

4. An apparatus according to claim 1, wherein said main body includes an image pickup part arranged to pick up an image of an object and to output an image signal corresponding to the image of the object picked up.

5. An apparatus according to claim 1, wherein said information storing device includes a storing medium.

6. An apparatus according to claim 1, wherein said information storing device includes a memory element.

7. An apparatus according to claim 1 further comprising a drive member for driving the first moving member.

8. An apparatus according to claim 7, wherein the second moving member operates in association with the operation of the drive member.

9. An apparatus according to claim 8, wherein said drive member has a portion which closes an opening for inserting the information storing device thereinto, provided on the first moving member, when the first moving member is at the second position.

10. An image pick-up apparatus usable with an information storing device having a plurality of electrical contacts which are connectable with a plurality of electrical contacts of a main body of said apparatus and to be detachably attachable to said main body, comprising:
    a) restriction means for restricting the detaching and attaching of the information storing device from and on the apparatus in a first direction; and
    b) moving means for moving the information storing device in a second direction different from the first direction after the information storing device is attached on the apparatus so as to bring the plurality of electrical contacts of the information storing device into contact with the plurality of electrical contacts of said main body;
    under the condition that the information storing device is charged in the main body in the first direction, at least one of the plurality of electrical contacts of the information storing device contacts a corresponding electrical contact of the plurality of electrical contacts of the main body, and under the condition that the information storing device is moved in the second direction by the moving means all of the plurality of electrical contacts of the information storing device contact corresponding electrical contacts of the plurality of electrical contacts of the main body.

11. An apparatus according to claim 10, wherein the plurality of electrical contacts of said main body include conductive members which are arranged to be urged by an urging member respectively and to be displaceable in a direction in which the information storing device moves the main body and to electrically connect said main body with said information storing device.

12. An apparatus according to claim 10, wherein said main body includes an image pickup part arranged to pick up an image of an object and to output an image signal corresponding to the image of the object picked up.

13. An apparatus according to claim 10, wherein said information storing device includes a storing medium.

14. An apparatus according to claim 10, wherein said information storing device includes a memory element.

* * * * *

UNITED STATES PATENT AND TRADEMARK OFFICE
CERTIFICATE OF CORRECTION

PATENT NO. : 5,657,081
DATED : August 12, 1997
INVENTOR(S) : Kurahashi, Sunao

It is certified that error appears in the above-indentified patent and that said Letters Patent is hereby corrected as shown below:

Col. 2, line 16, delete "Waterproof" and insert -- waterproof --.

Signed and Sealed this

Fourth Day of August, 1998

Attest:

BRUCE LEHMAN

Attesting Officer

Commissioner of Patents and Trademarks